(12) United States Patent
Thomas et al.

(10) Patent No.: US 10,174,242 B1
(45) Date of Patent: Jan. 8, 2019

(54) COATED THIOALUMINATE PHOSPHOR PARTICLES

(71) Applicant: EIE MATERIALS, INC., Lexington, KY (US)

(72) Inventors: Alan C. Thomas, Yardley, PA (US); Yuming Xie, Sugar Land, TX (US); Jonathan Melman, Lexington, KY (US); Robert Nordsell, Lexington, KY (US)

(73) Assignee: EIE MATERIALS, INC., Lexington, KY (US)

( * ) Notice: Subject to any disclaimer, the term of this patent is extended or adjusted under 35 U.S.C. 154(b) by 0 days.

(21) Appl. No.: 15/993,116

(22) Filed: May 30, 2018

Related U.S. Application Data

(60) Provisional application No. 62/672,729, filed on May 17, 2018, provisional application No. 62/673,044, filed on May 17, 2018.

(51) Int. Cl.
*C09K 11/02* (2006.01)
*C09K 11/77* (2006.01)
*H01L 33/50* (2010.01)

(52) U.S. Cl.
CPC ............ *C09K 11/025* (2013.01); *C09K 11/77* (2013.01); *H01L 33/502* (2013.01)

(58) Field of Classification Search
CPC . H01L 33/502; C09K 11/025; C09K 11/7701; C09K 11/7703
See application file for complete search history.

(56) References Cited

U.S. PATENT DOCUMENTS

| | | |
|---|---|---|
| 3,639,254 A | 2/1972 | Peters |
| 3,801,702 A | 4/1974 | Donohue |
| 4,441,046 A | 4/1984 | James |
| 4,937,150 A * | 6/1990 | Tsukada ................. C09K 11/00 252/301.4 R |
| 5,747,929 A | 5/1998 | Kato et al. |
| 6,417,019 B1 | 7/2002 | Mueller et al. |
| 6,597,108 B2 | 7/2003 | Yano et al. |
| 6,614,173 B2 | 9/2003 | Yano et al. |
| 6,627,251 B2 | 9/2003 | Yano et al. |
| 6,773,629 B2 | 8/2004 | Le Mercier et al. |
| 6,855,271 B2 * | 2/2005 | Chua ....................... C09K 11/02 252/301.4 F |
| 6,926,848 B2 | 8/2005 | Le Mercier et al. |
| 7,005,198 B2 | 2/2006 | Yano et al. |
| 7,018,565 B2 | 3/2006 | Tian et al. |
| 7,125,501 B2 | 10/2006 | Tian et al. |
| 7,368,179 B2 | 5/2008 | Tian et al. |
| 7,400,085 B2 * | 7/2008 | Hasegawa ............ C09K 11/025 252/301.6 S |
| 7,427,366 B2 | 9/2008 | Tian et al. |
| 7,453,195 B2 | 11/2008 | Radkov |
| 7,497,973 B2 | 3/2009 | Radkov et al. |
| 7,651,631 B2 | 1/2010 | Igarashi et al. |
| 7,768,189 B2 | 8/2010 | Radkov |
| 7,816,862 B2 | 10/2010 | Noguchi et al. |
| 8,921,875 B2 | 12/2014 | Letoquin et al. |
| 9,219,201 B1 | 12/2015 | Todorov et al. |
| 9,243,777 B2 | 1/2016 | Donofrio et al. |
| 9,496,464 B2 | 11/2016 | Yao et al. |
| 9,530,944 B2 | 12/2016 | Jacobson et al. |
| 9,607,821 B2 | 3/2017 | Levin et al. |
| 2002/0155317 A1 | 10/2002 | Yano et al. |
| 2003/0042845 A1 | 3/2003 | Pires et al. |
| 2007/0284563 A1 | 12/2007 | Lee et al. |
| 2008/0296533 A1 | 12/2008 | Stiles et al. |
| 2013/0114242 A1 | 5/2013 | Pickard et al. |
| 2013/0313516 A1 | 11/2013 | David et al. |
| 2014/0077689 A1 | 3/2014 | Thompson et al. |
| 2014/0307417 A1 | 10/2014 | Yamakawa et al. |
| 2014/0321099 A1 | 10/2014 | Kaide et al. |
| 2016/0009990 A1 | 1/2016 | Yoo et al. |
| 2016/0223146 A1 | 8/2016 | Vick et al. |

FOREIGN PATENT DOCUMENTS

| | | | |
|---|---|---|---|
| JP | 08-302342 | * | 11/1996 |
| WO | WO 2014/128676 | * | 8/2014 |

OTHER PUBLICATIONS

Translation for JP 08-302342, Nov. 19, 1996.*
Ruijin Yu et al., "Luminescence properties of stoichionmetric EuM2S4 (M=Ga, Al) conversion phosphors for white LED applications", Phys. Status Solidi A, May 31, 2012, pp. 1-6, DOI 10.1002/pssa. 201228348, Wiley Online Library.
K.T. Le Thi, et al., "Investigation of the MS-Al2S3 systems (M=Ca, Sr, Ba) and luminescence properties of europium-doped thioaluminates",Materials Science and Engineering, B14 (1992) pp. 393-397.
P.C. Donohue, et al., "The Synthesis and Photoluminescence of MiiM2iii(S,Se)4", J. Electrochem. Soc. 1974, vol. 121, Issue 1, pp. 137-142.
A.G. Paulusz, "Efficient Mn(IV) Emission in Fluorine Coordination", J. Electrochem. Soc.: Solid-State Science and Technology, Jul. 1973, pp. 942-947.
Zhang, et al., "Robust and Stable Narrow-Band Green Emitter: An Option for Advanced Wide-Color-Gamut Backlight Display", CM Chemistry of Materials, Chem. Mater. 2016, 28, pp. 8493-8497.

(Continued)

*Primary Examiner* — C Melissa Koslow
(74) *Attorney, Agent, or Firm* — Innovation Counsel LLP

(57) ABSTRACT

Thioaluminate phosphor particles having a coating comprising or consisting essentially of a nitride, and methods for making such phosphor particles, are disclosed. Phosphor-converted light emitting diodes may comprise such coated phosphor particles. The nitride coatings on the thioaluminate phosphor particles provide a significantly improved barrier to water compared, to an aluminum oxide coating, and extend the operational lifetime of such a phosphor-converted light emitting diode.

20 Claims, 5 Drawing Sheets

(56) References Cited

OTHER PUBLICATIONS

International Search Report, PCT/US2018/020914, dated May 17, 2018, 1 page.

* cited by examiner

COATED THIOALUMINATE PHOSPHOR PARTICLES

CROSS REFERENCE TO RELATED APPLICATIONS

This application claims benefit of priority to U.S. Provisional Patent Application 62/672,729 titled "Coated Thioaluminate Phosphor Particles" and filed May 17, 2018, which is incorporated herein by reference in its entirety.

This application also claims benefit of priority to U.S. Provisional Patent Application No. 62/673,044 titled "Phosphors With Narrow Green Emission" and filed May 17, 2018, which is incorporated herein by reference in its entirety.

This application is related to U.S. patent application Ser. No. 15/990,378 titled "Phosphors With Narrow Green Emission" and filed May 28, 2018, which is incorporated herein by reference in its entirety.

This application is also related to U.S. patent application Ser. No. 15/591,629 titled "Phosphors With Narrow Green Emission" and filed May 10, 2017, now U.S. Pat. No. 10,017,396, which is incorporated herein by reference in its entirety.

This invention was made with federal government support from the National Science Foundation under award number 1534771. The federal government has certain rights in the invention.

FIELD OF THE INVENTION

The invention relates generally to coated thioaluminate phosphor particles and to methods for coating thioaluminate phosphor particles.

BACKGROUND

Over the past several years, LED lighting has delivered huge improvements in energy efficient lighting while simultaneously enabling high quality. Another feature of LED lighting is the very long life of the lighting product, typically with an L70 (the amount of time a light source will operate before its lumen output drops to 70% of its initial output) greater than 25,000 hours. By contrast, the incumbent light sources LEDs replace typically have L70 of 10,000 hours (fluorescent lighting) or catastrophic failure at about 1000 hours (incandescent). This long life is a function of all components in the LED light source, but especially the blue or violet emitting diode and the down-converting phosphor materials which absorb light emitted by the diode and convert it to other colors to complete the visible spectrum. When the diode degrades, the LED becomes less bright, but retains its color balance. However, when a phosphor degrades the LED typically becomes less bright and also loses its color balance. The LED may take on a non-white hue. Color shift is typically more problematic from the user perspective.

The most common architecture for LED packages is to disperse a phosphor material in a silicone matrix to form a slurry and deposit this slurry into a reflective cup area which also includes the light emitting diode. The package has two types of reflective areas, a diffuse reflective surface typically made of plastic or ceramic and a more specular reflective surface which is formed from the electrical contacts. Typically, the specular reflective surfaces are plated with silver to significantly enhance the reflectivity and increase light extraction from the package.

An LED phosphor is usually made up of an activator ion, typically divalent europium or trivalent cerium, in a host. The activator ion directly absorbs the incoming light and emits light of a longer wavelength in a process typically called down-conversion. That is, an incident photon is down-converted from a higher energy blue photon to a lower energy photon, such as cyan, green, yellow, orange, or red. The host helps tune the absorptive and emissive wavelengths of the activator. Additionally, the degree of crystallinity of the host around the activator can play a large role in the efficiency of absorption and emission.

Phosphor degradation is typically attributed to the action of water or oxygen in the presence of the heat and light produced by the LED. It has become common practice to coat many types of phosphors with a layer to prevent the water or oxygen from coming in contact with the phosphor and facilitating degradation. Typically, these coatings are inorganic oxides, and are deposited on the phosphor either by a solution phase, e.g. sol-gel, reaction, or a vapor phase reaction.

A phosphor can typically degrade through three mechanisms. First, oxidation of the activator can eliminate its 4f orbital to 5d orbital charge transfer absorption, rendering it unable to absorb the incident light. Second, the host may deform chemically, changing the energy of the activator's absorption and emission. Third the host may deform physically, losing crystallinity around the activator, and decreasing the efficiency of the activator's absorption and emission. Typically, a low temperature chemical change to the host will also result in a loss of crystallinity. The overall impact of these degradations is dependent upon the extent to which the host, in either its pristine or degraded state, allows the water or oxygen to permeate through the material. For example, degradation of cerium doped yttrium aluminum garnet phosphor materials is very slow relative to europium doped alkali earth orthosilicate phosphors.

Unlike oxide and nitride phosphors, which make up almost the entirety of commercially used phosphors, sulfide-based phosphors (e.g., thioaluminate phosphors) add an additional LED failure mechanism. A hydrolysis reaction with water can release sulfur from the phosphor which can degrade performance by, for example, tarnishing the reflective surfaces in the LED package. This blackening can vastly decrease the light output of the phosphor-converted LED. Thus, failure to properly coat sulfide phosphors can create a larger problem than failure to properly coat oxide or nitride phosphors.

The ability to effectively coat sulfide phosphors is hindered by the differences in surface chemistry between these phosphors and their oxide or nitride analogues.

SUMMARY

In one aspect of the invention, thioaluminate phosphor particles have a coating comprising, consisting essentially of, or consisting of a nitride. The nitride coating may comprise, consist essentially of, or consist of aluminum nitride, gallium nitride, or a mixture thereof, for example. The nitride coatings on the thioaluminate phosphor particles provide a significantly improved barrier to water, compared to an aluminum oxide coating. This improvement may be due to non-reactivity of the nitride coating precursor with the volatilized gases from an unstable sulfide phosphor surface.

In another aspect of the invention, methods are disclosed for making such nitride coated thioaluminate phosphor particles.

In yet another aspect of the invention, a phosphor converted LED comprises such nitride coated thioaluminate phosphor particles.

These and other embodiments, features and advantages of the present invention will become more apparent to those skilled in the art when taken with reference to the following more detailed description of the invention in conjunction with the accompanying drawings that are first briefly described.

DETAILED DESCRIPTION

Figure 1:
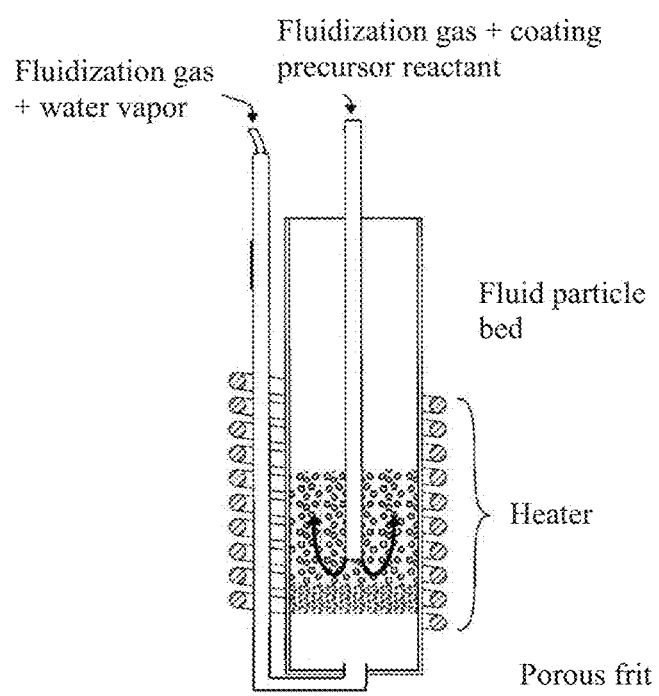
FIG. 1 shows a schematic of an example fluidized bed reactor for chemical vapor deposition on phosphor particles.

The following detailed description should be read with reference to the drawings, which depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. As used in this specification and the appended claims, the singular forms "a," "an," and "the" include plural referents unless the context clearly indicates otherwise.

Sulfide phosphors can have very attractive spectral properties. Specifically, the emission spectrum of many sulfide phosphors can be very narrow, characterized by a full width at half maximum (FWHM) of less than 50 nm, and sometimes as little 25 to 30 nm. This spectral narrowness can be extremely attractive in display backlighting and general lighting applications.

Divalent rare earth activated sulfide phosphors of interest include $RE_{1-w}A_wM_xE_y$, where RE may be one or more rare earth elements (for example, Eu or Gd), A may be one or more elements selected from the group Mg, Ca, Sr, or Ba, M may be one or more elements selected from the group Al, Ga, B, In, Sc, Lu or Y, E comprises sulfur and optionally at least one of Selenium, Oxygen, and Tellurium, w is greater than or equal to zero, and less than or equal to about 0.99 or less than or equal to 1.0, $2 \leq x \leq 4$, and $4 \leq y \leq 7$. Such phosphors may be referred to herein as thioaluminate or calcium thioaluminate phosphors. Typically, they are capable of absorbing blue or ultraviolet light and in response emitting light having a peak wavelength in the green region of the visible spectrum.

These thioaluminate phosphors may react with water to release $H_2S$ and convert part of the sulfide host to oxide. This change impacts the optical properties of the phosphor, typically shifting the absorption to much higher energy as well as decreasing the absorption and emission intensities due to a decrease of crystallinity around the activator center.

Free sulfide, such as that which can be released from hydrolysis of sulfide phosphors as $H_2S$ or similar species, can disrupt the packaging on several levels. At high concentrations, it can inhibit the curing of silicones used for encapsulation. This inhibition of curing means that phosphor can move within the package, shifting the color point of the LED, and that the wire bonds from the contacts to the die are not protected, making the LED more prone to catastrophic failure from breakage of the electrical connections. At lower concentrations, the sulfide can react over time to corrode and blacken the silver of the electrical contact pads and the gold of the wire bond from the contact to the die. This latter degradation mechanism can also come into play if cationic sulfur sources, such as $SO_2$, are present, and may be accelerated by the electrochemical potential present as current flows through the package.

All of these mechanisms shorten the lifetime of the phosphor-converted LED light source.

As noted above, it is known that coating phosphor particles can inhibit the progress of water into the phosphor and impede its degradation. Common methods of coating are the creation of a silica layer by a sol-gel process or an alumina layer by chemical vapor deposition.

In a sol-gel process, the phosphor particles are suspended in a solvent. The solvent contains a coating precursor, and a reaction is initiated to form the precursor into a continuous coating on the phosphor particles. Depending on the system, the precursor may be initiated in the presence of the phosphor, or it may be initiated prior to introduction of the phosphor. As an example, phosphor may be stirred in an aqueous or ethanolic solution of tetraethoxysilane (TEOS). The coating process may then be initiated by the addition of an ammonia solution to change the pH and accelerate the rate of hydrolysis of the silane forming a silica coating on the phosphor. Other types of precursors are known, such as ethanolic titanium isopropoxide and aqueous aluminum nitrate. Many other sol-gel chemistries are known and may be utilized.

A chemical vapor deposition process is typically performed on particles which have been fluidized in a fluidized bed. Creation of the fluidized bed typically entails placing the phosphor powder in a column that has a gas permeable but powder impermeable membrane or frit at the bottom. The powder is suspended by the upward force of the gas which counteracts the downward force of gravity. This fluidization enables access to all surfaces of the phosphor particles which might not otherwise be exposed in solid powder or even in a stirred solution. A second gas stream may carry a second precursor for the coating, and may deliver it to near the middle of the fluidization zone. An example fluidized particle coating system is depicted in FIG. 1.

One such fluidization system arrangement uses argon as a fluidizing gas, and in two separate streams bubbles the argon through water then up through the frit and through trimethyl aluminum (TMA) then into the midst of the fluidization zone. These reactants are mixed in the fluidization zone, and the zone is heated to 100° C.-300° C. The hydrolysis of TMA then proceeds to form an amorphous aluminum oxide coating on the phosphor particles. Other inert carrier gases can be used besides argon, for example nitrogen.

An alumina coating may also be deposited in a layer by layer process, sometimes called atomic layer deposition (ALD), where the phosphor particles are treated with a small concentration of water to form a water/hydroxide layer on the surface of the particles, the reaction chamber is evacuated to remove all the water and then filled with a small concentration of TMA, which reacts with the surface hydroxyls left from the water to form an aluminum oxide layer. The chamber is again evacuated to and filled with a low concentration of water, and the steps are repeated until the desired number of layers have been deposited.

The exact thickness of the coating will be determined, in part, by the method used; ALD will form the thinnest coating layer, CVD will form a thicker coating, while sol-gel will generally form a much thicker coating.

Attempts to coat thioaluminate phosphor materials by various sol-gel methods have resulted in significant degradation of the absorption and emission properties of the phosphor material due to chemical reactivity of the phosphor.

Attempts to form an alumina or alumina plus other metal oxide coating on thioaluminate phosphor materials by CVD/fluidized bed methods or ALD methods with trimethyl aluminum and water were more successful, in that the material did not show a complete degradation during the coating process. However, these coating methods did not form a barrier that enabled the phosphor materials to survive normal LED reliability tests.

Normally, a phosphor is tested as part of packaged LEDs by observing its lumen maintenance and color shift over a period of time under different conditions. A typical test would be a high temperature operating life (HTOL) test, where the LEDs are powered on in a test oven at an elevated temperature. Typical temperatures for HTOL testing are 85° C. and 125° C., and typical durations are 1008 hours and 6000 hours. Another typical test would be a wet, high temperature operating life (WHTOL) test, where the LEDs may be powered on the entire time, or may be power cycled at regular intervals in a test oven at an elevated temperature and elevated, controlled humidity. Typical conditions for WHTOL testing are 60° C./90% relative humidity (60/90) and 85° C./85% relative humidity (85/85), and the typical duration is 1008 hours. Success criterion may vary depending on who is administering the test, but generally lumen maintenance should be at least greater than 80% after 1008 hours of WHTOL testing. That is, the brightness at the end should be at least 80% of the initial brightness, and color shift as measured by $\Delta u'v'$ (the change in color coordinates as measured in CIE 1976 color space from the beginning of the test period to the end of the test period) should be at least less than 0.007.

Additionally, coated sulfide phosphors may be tested for the effectiveness of the coating in sealing in the sulfur by subjecting the phosphor powder to a solution of silver nitrate. The silver ions in solution will react with any sulfide that has not been shielded from the solution by the coating and form black $Ag_2S$. This black precipitate is readily visible once formed, and the time to its appearance can be used as a gauge of the effectiveness of the coating.

For example, some samples of alumina coated europium doped strontium thiogallate, a well-studied phosphor, do not darken in silver nitrate solution for approximately 336 hours, and maintain approximately 80% of their initial brightness after 1008 hours of 60/90 testing.

In contrast, some of the more robust samples of alumina coated europium doped calcium thioaluminate darken in silver nitrate solution after approximately 20 minutes and fail to maintain 80% of their initial brightness after only 168 hours of testing.

Figure 2:
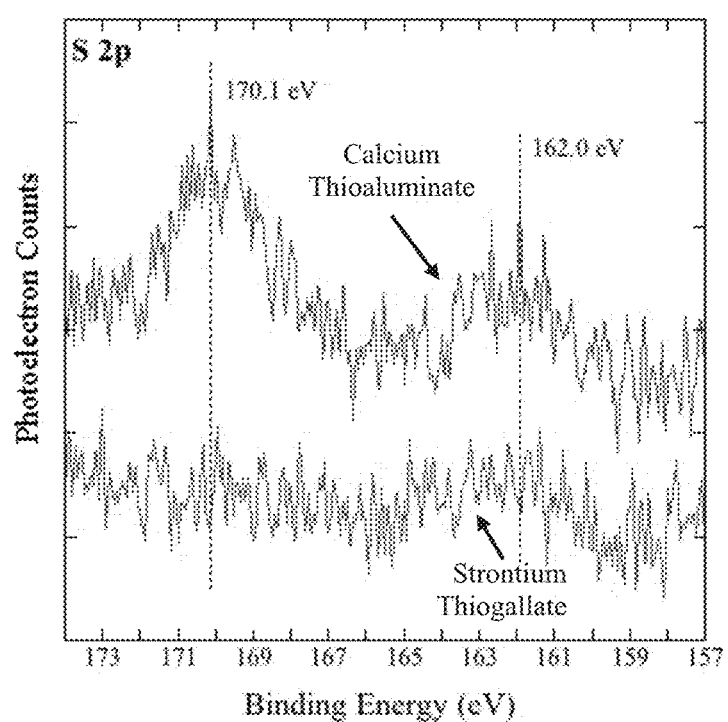
FIG. 2 shows x-ray photoelectron spectroscopy spectra in the sulfur 2p region for two coated phosphor samples.

As shown in FIG. 2, analyses of strontium thiogallate (STG) phosphors coated with an alumina coating and of a calcium thioaluminate phosphor coated with an alumina coating by XPS in the sulfur 2p region show negligible, if any, signal for the STG, but noticeable intensity between 160 and 172 eV (ca. 3 atom %) for the calcium thioaluminate phosphors. This sulfur is anticipated to be reactive with humidity and facilitate failure of the phosphor as determined by various test methods (silver nitrate solution and packaged LED testing). It is speculated that the thioaluminate phosphors volatilize sulfide during the coating process, which is then continually redeposited with the outer layer of the coating.

Figure 3:
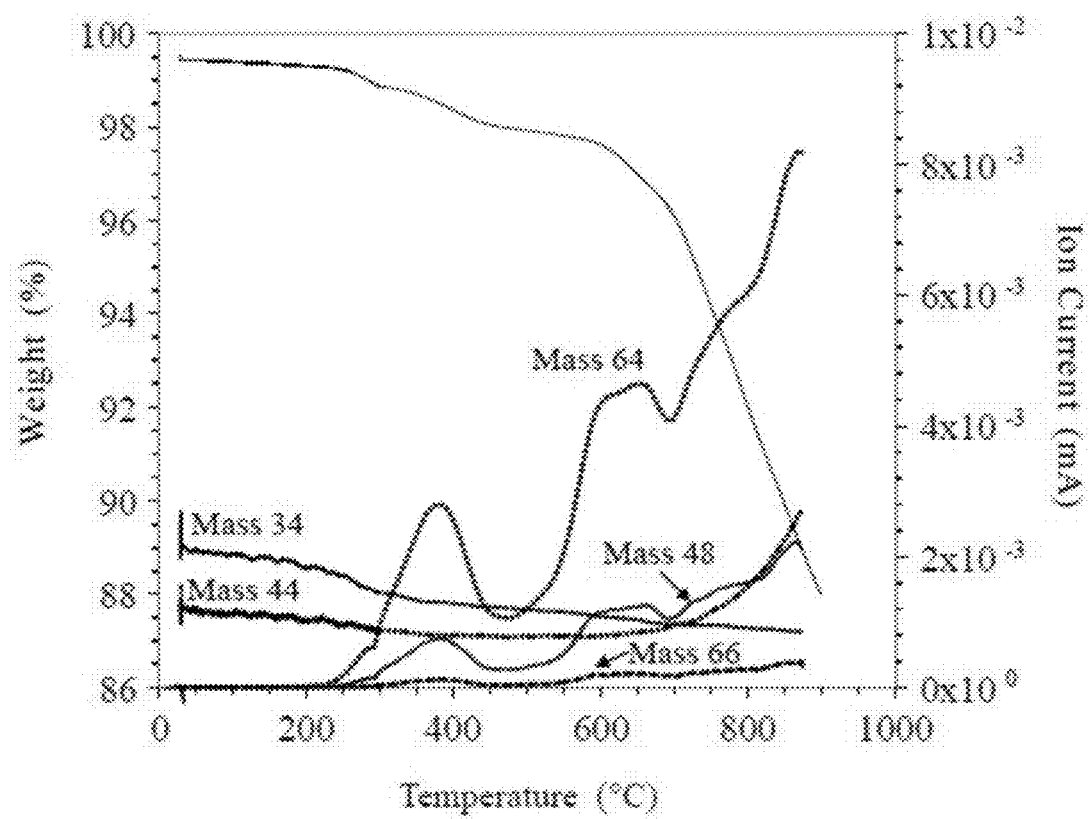
FIG. 3 shows example thermal gravimetric—mass spectroscopy data for a sample of an uncoated calcium thioaluminate phosphor.

To help test the speculation regarding sulfur in the coating of thioaluminate, several uncoated calcium thioaluminate phosphors were analyzed by thermal gravimetric analysis coupled with mass spectrometry (TGA-MS). In this technique, a sample is heated under a flowing gas, its mass is monitored, and the effluent gas is analyzed by mass spectrometry. Specifically, calcium thioaluminate phosphors, which were subjected to several different work-up regimes, were heated under inert gas (argon) and showed mass number 34 corresponding to $H_2S$ as the primary mass loss at temperatures up to about 300° C. An example data set is shown in FIG. 3. Also shown in FIG. 3: mass number 44 corresponds to $CO_2$ or $CH_2CHO$, mass 48 corresponds to SO or $CH_3SH$, mass 64 corresponds to $SO_2$, and mass 66 corresponds to $H_2S_2$.

These analyses point to the incompatibility of the thioaluminate phosphor surface and the chemistries used to deposit oxide based coatings. This incompatibility arises as the coating chemistry volatilizes some sulfur from the surface and redeposits it as part of the coating layer, creating a continuous, reactive pathway for water to penetrate the coating and react with/degrade the phosphor material.

As a result of the deficiencies discovered in trying to apply an oxide coating to calcium thioaluminate phosphors, it became apparent to the inventors that a significant change in the coating methodology was necessary. The inventors then developed an improved coating method that involves coating the thioaluminate phosphor material with a nitride layer rather than with aluminum oxide. Aluminum nitride, gallium nitride, and mixtures of the two may be suitable for such coatings, for example. In this process, pure ammonia, or ammonia with an inert gas, is used as the fluidizing gas and trimethyl aluminum can be used as the aluminum source to deposit an aluminum nitride layer. Alternatively, trimethyl gallium may be substituted for the trimethyl aluminum to deposit a gallium nitride layer instead of an aluminum nitride layer. A mixed aluminum nitride and gallium nitride layer may be deposited by using both trimethyl aluminum and trimethyl gallium in the process.

Another coating layer, such as for example alumina, silica, or alumina and silica may optionally be added above the aluminum nitride layer, by for example one of the coating methods described above. In some variations there may be an oxide layer below the aluminum nitride layer, formed during washing of the phosphor particle prior to deposition of the nitride coating. Hence in some variations there may be oxide or other layers above and below the nitride layer.

Table 1 below presents data for a series of coating runs, all of which were run with the same phosphor lot. These data are, for each coating experiment, a reference number, the amount of phosphor charged to the reactor, the amount of phosphor recovered, the temperature that the reactor was held at during the coating cycle, the duration of the coating cycle, the flow rate of the argon gas through the trimethyl aluminum bubbler and into the reactor (L/min), the flow rate of anhydrous ammonia into the reactor (L/min), the weight ratio of nitrogen and aluminum precursor used, and the theoretical amount of aluminum nitride formed in relation to the amount of phosphor in the reactor.

Table 2 below presents spectroscopic data on the phosphor sample before coating, and after each of the coating runs. Additionally, a separate lot of phosphor was coated by ALD and spectroscopic data is presented for the sample prior to coating and after coating.

Thioaluminate samples coated with aluminum nitride or with $Al_2O_3$ were tested by subjecting the phosphor powder to the silver nitrate solution test described above. In these tests, several mg of coated phosphor were placed in a small vial. A few mL of 0.01 M $AgNO_{3\,(aq)}$ were added to the vial, and the time recorded when a predetermined level of blackening due to the formation of silver sulfide was observed by the naked eye. The recorded time is the time to failure (TTF), and gives a relative gauge of the effectiveness of the coating. Table 3 below reports $AgNO_3$ time to failure for a sample with the best $Al_2O_3$ coatings, a sample with an AlN coating deposited by ALD, and two samples with CVD AlN coatings. After 19 minutes, darkening was observed in the best $Al_2O_3$ coating. By 40 minutes the AlN by ALD sample had darkened. After 3 hours, darkening was observed in the earlier AlN by CVD (NBG20180326) sample, while darkening is first observed in the later AlN by CVD (NBG20180327) sample after 4.5 hours.

These test results (e.g., for NBG20180327) show that a reaction temperature of 300° C. is sufficient to a provide barrier coating of aluminum nitride on a thioaluminate phosphor particle that is more effective than the best alumina coating prepared for this study. Scanning electron microscopy (SEM) and transmission electron microscopy of a cross sectioned NBG20180327 phosphor particle show that the aluminum nitride barrier coating is polycrystalline and has a thickness of 50-60 nm. The aluminum nitride was identified by EDS. Scanning electron microscopy (SEM) and transmission electron microscopy of a cross sectioned thioaluminate phosphor particle that was coated with the best alumina coating show that the alumina coating has a thickness greater than 200 nm.

Figure 4A:
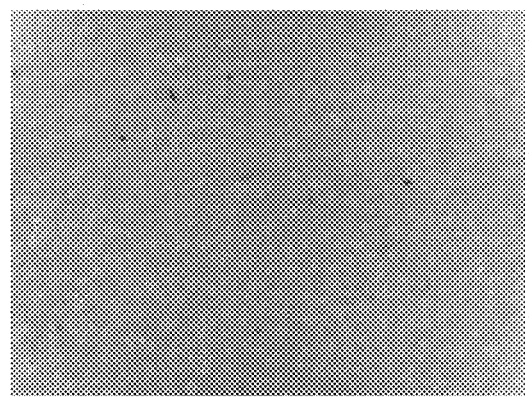
FIG. 4A shows a microscope image of a sample of ZnS coated with $Al_2O_3$ after an $AgNO_3$ test.
Figure 4B:
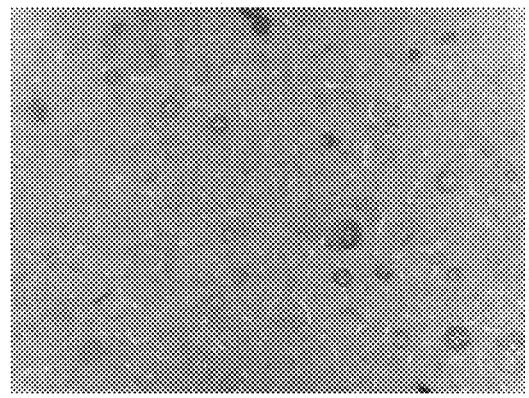
FIG. 4B shows a microscope image of a sample of ZnS coated with AlN after an $AgNO_3$ test.
Figure 4C:
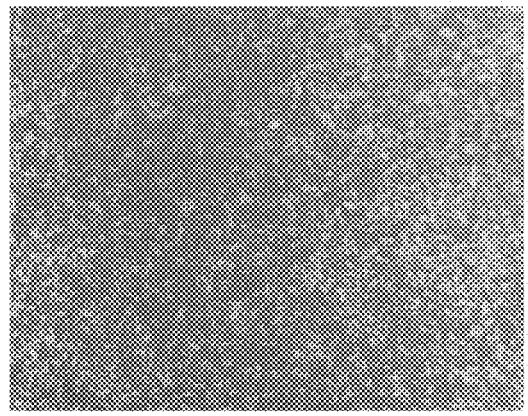
FIG. 4C shows a microscope image of calcium thioaluminate phosphor particles coated with $Al_2O_3$ after an $AgNO_3$ test.
Figure 4D:
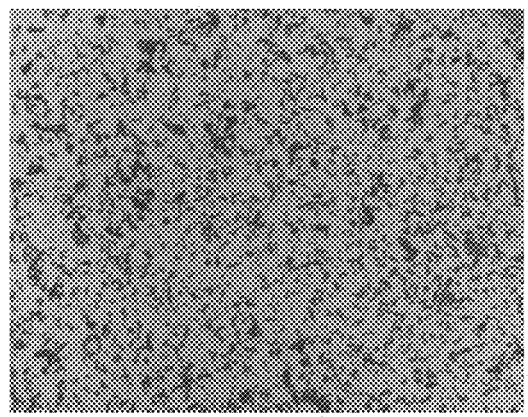
FIG. 4D shows a microscope image of calcium thioaluminate phosphor particles coated with AlN after an $AgNO_3$ test.

In an additional test, samples were attached to glass slides with double-sided tape, immersed in silver nitrate solution, and observed over the course of several hours. Four samples were compared: zinc sulfide coated with $Al_2O_3$, shown in FIG. 4A; zinc sulfide coated with AlN, shown in FIG. 4B; a thioaluminate phosphor sample, NBG20180301, coated with a previously identified best alumina coating, shown in FIG. 4C; and a sample of the same phosphor lot coated with AlN (example NBG20180327), shown in FIG. 4D. After about 8 hours the samples were compared. The zinc sulfide with alumina coating showed no darkening, while the zinc sulfide with aluminum nitride coated showed some percentage of darkening. The phosphor sample with alumina coating had a few green phosphor particles left, however it had almost entirely darkened (FIG. 4C), while the aluminum nitride coated sample appeared less than half darkened (FIG. 4D).

The nitride coated thioaluminate phosphors of the present invention may be optically coupled with an excitation source in any conventional manner. One of the more common methods is to combine green emitting phosphors, such as the nitride coated thioaluminate phosphors disclosed here, with a red phosphor and optional blue and/or yellow phosphors. The phosphors may be combined together and then added to an encapsulant, such as silicone, epoxy, or some other polymer, or the phosphors may be combined during their addition to the encapsulant. The phosphor loaded encapsulant may then be placed in the optical path of an excitation source, such as an LED or laser diode that emits ultraviolet, violet, or blue light. One common method is to deposit the slurry of phosphor or phosphors into an LED (light emitting diode) package which contains an LED die. The slurry is then cured forming an encapsulated LED package. Other methods include forming the encapsulant into a shape or coating the encapsulant onto a substrate which may already be in a particular shape, or may be subsequently formed into a particular shape. Additionally, the phosphor containing encapsulant may be disposed on or near (e.g., coated on) the in-coupling region of a light guide, or on the out-coupling region of a light guide, such as a light guide intended for use in a display. Alternatively, the phosphor composition may be deposited as a thin film on the LED die or on another substrate and subsequently optically coupled to the light source. The combination of an excitation source and the phosphors of the present invention may be used in general lighting, niche lighting applications, display backlighting, or other lighting applications.

TABLE 1

Coating run data

| Coating Sample # | Mass, Initial | Mass, Final | Reactor Temp. | Reactor time | Rate, Ar/TMA | Rate, $NH_3$ | $NH_3$/TMA wt ratio | % AlN eq |
|---|---|---|---|---|---|---|---|---|
| NBG20180326 | 1 | 0.5 | 300 | 1 | 0.030 | 0.029 | 9.9 | 7.3% |
| NBG20180327 | 1.2 | 0.7 | 300 | 1 | 0.016 | 0.013 | 9 | 3.1% |
| NBG20180328 | 1.1 | 0.66 | 250 | 1 | 0.012 | 0.011 | 9.3 | 2.7% |
| NBG20180329 | 1.5 | 0.9 | 300 | 1.5 | 0.016 | 0.011 | 7.3 | 3.7% |

TABLE 2

Spectroscopic data:

| Coating Sample # | λpeak (nm) | FWHM (nm) | PL % |
|---|---|---|---|
| Uncoated | 528 | 40 | 107 |
| NBG20180326 | 527 | 41 | 83 |
| NBG20180327 | 527 | 41 | 94 |
| NBG20180328 | 526 | 41 | 94 |
| NBG20180329 | 526 | 41 | 90 |
| Uncoated | 527 | 39 | 113 |
| AlN by ALD 100 nm | 525 | 40 | 69 |

TABLE 3

AgNO₃ resistance test data:

| Coating Sample # | AgNO$_3$ TTF, hours |
|---|---|
| (a) Al$_2$O$_3$ | 0.3 |
| (b) AlN by ALD | 0.5 |
| (c) AlN by CVD (NBG20180326) | 3 |
| (d) AlN by CVD (NBG20180327) | 4.5 |

This disclosure is illustrative and not limiting. Further modifications will be apparent to one skilled in the art in light of this disclosure and are intended to fall within the scope of the appended claims.

What is claimed is:

1. A luminescent composition of matter comprising:
   particles of a sulfide phosphor material characterized by the formula $RE_{1-w}A_wM_xE_y$, wherein:
   RE is a Rare Earth element or a mixture of Rare Earth elements;
   A is selected from the group consisting of Magnesium, Calcium, Strontium, Barium, and mixtures thereof;
   M is selected from the group consisting of Aluminum, Gallium, Boron, Indium, Scandium, Lutetium, Yttrium, and mixtures thereof;
   E comprises sulfur and optionally at least one of Selenium, Oxygen, and Tellurium;

$0 \leq w \leq 1.0$;

$2 \leq x \leq 4$; and $4 \leq y \leq 7$;

and a nitride coating layer comprising aluminum nitride, gallium nitride, or a mixture of aluminum nitride and gallium nitride on each particle.

2. The luminescent composition of matter of claim 1, wherein the nitride coating layer comprises aluminum nitride.

3. The luminescent composition of matter of claim 1, wherein the nitride coating layer consists essentially of aluminum nitride.

4. The luminescent composition of matter of claim 1, wherein the nitride coating layer comprises gallium nitride.

5. The luminescent composition of matter of claim 1, wherein the nitride coating layer consists essentially of gallium nitride.

6. The luminescent composition of matter of claim 1, wherein the sulfide phosphor material is capable of absorbing blue, violet, or ultraviolet light and in response emitting light having a peak wavelength in the green region of the visible spectrum.

7. The luminescent composition of matter of claim 1, wherein the nitride coating layer is disposed directly on the sulfide phosphor material.

8. The luminescent composition of matter of claim 1, wherein each particle comprises an oxide layer disposed between the sulfide phosphor material and the aluminum nitride coating layer.

9. The luminescent composition of matter of claim 1, wherein each particle comprises at least a second coating layer disposed on the nitride coating layer.

10. The luminescent composition of matter of claim 9, wherein the second coating layer is an oxide layer.

11. The luminescent composition of matter of claim 1, wherein RE is Europium.

12. A light emitting device comprising:
    a light emitting diode that emits primary light; and
    particles of a sulfide phosphor material characterized by the formula $RE_{1-w}A_wM_xE_y$, wherein:
    RE is a Rare Earth element or a mixture of Rare Earth elements;
    A is selected from the group consisting of Magnesium, Calcium, Strontium, Barium, and mixtures thereof;
    M is selected from the group consisting of Aluminum, Gallium, Boron, Indium, Scandium, Lutetium, Yttrium, and mixtures thereof;
    E comprises sulfur and optionally at least one of Selenium, Oxygen, and Tellurium;

$0 \leq w \leq 1.0$;

$2 \leq x \leq 4$; and $4 \leq y \leq 7$;

wherein the sulfide phosphor material is capable of absorbing at least a portion of the primary light and in response emitting secondary light having a wavelength longer than a wavelength of the primary light, and each particle of the sulfide phosphor material comprises a nitride coating layer comprising aluminum nitride, gallium nitride, or a mixture of aluminum nitride and gallium nitride.

13. The light emitting device of claim 12, wherein the nitride coating layer comprises aluminum nitride.

14. The light emitting device of claim 12, wherein the nitride coating layer consists essentially of aluminum nitride.

15. The light emitting device of claim 12, wherein the nitride coating layer comprises gallium nitride.

16. The light emitting device of claim 12, wherein the nitride coating layer consists essentially of gallium nitride.

17. The light emitting device of claim 12, wherein the secondary light has a peak wavelength in the green region of the visible spectrum.

18. The light emitting device of claim 12, wherein RE is Europium.

19. The light emitting device of claim 18, wherein the primary light is blue light.

20. The light emitting device of claim 19, wherein the secondary light has a peak wavelength in the green region of the visible spectrum.

* * * * *